(12) United States Patent
Piper et al.

(10) Patent No.: US 9,035,418 B2
(45) Date of Patent: May 19, 2015

(54) NITRIDE SHALLOW TRENCH ISOLATION (STI) STRUCTURES

(71) Applicants: Daniel Piper, Vancouver, WA (US);
Franklin Chiang, Vancouver, WA (US);
Ganesh Yerubandi, Vancouver, WA (US)

(72) Inventors: Daniel Piper, Vancouver, WA (US);
Franklin Chiang, Vancouver, WA (US);
Ganesh Yerubandi, Vancouver, WA (US)

(73) Assignee: WAFERTECH, LLC, Camas, WA (US)

( * ) Notice: Subject to any disclaimer, the term of this patent is extended or adjusted under 35 U.S.C. 154(b) by 0 days.

(21) Appl. No.: 13/969,760

(22) Filed: Aug. 19, 2013

(65) Prior Publication Data

US 2013/0334652 A1    Dec. 19, 2013

Related U.S. Application Data

(62) Division of application No. 13/222,698, filed on Aug. 31, 2011, now Pat. No. 8,530,327.

(51) Int. Cl.
*H01L 21/70* (2006.01)
*H01L 29/06* (2006.01)
*H01L 21/762* (2006.01)

(52) U.S. Cl.
CPC ...... *H01L 29/0649* (2013.01); *H01L 21/76232* (2013.01)

(58) Field of Classification Search
None
See application file for complete search history.

(56) References Cited

U.S. PATENT DOCUMENTS

| | | | | |
|---|---|---|---|---|
| 4,960,727 A | * | 10/1990 | Mattox et al. | 438/437 |
| 6,054,343 A | | 4/2000 | Ashburn | |
| 6,255,218 B1 | * | 7/2001 | Kasai | 438/700 |
| 6,268,264 B1 | | 7/2001 | Tseng | |
| 7,056,804 B1 | * | 6/2006 | Lyons et al. | 438/424 |

* cited by examiner

*Primary Examiner* — Sonya D McCall Shepard
(74) *Attorney, Agent, or Firm* — Duane Morris LLP

(57) ABSTRACT

A shallow trench isolation (STI) structure includes a top surface formed completely of silicon nitride. The top surface of the STI structure is coplanar with a top substrate surface or extends above the top substrate surface. The STI structures include further dielectric materials beneath the silicon nitride and an oxide liner and any portions that extend above the substrate surface are formed of silicon nitride.

16 Claims, 14 Drawing Sheets

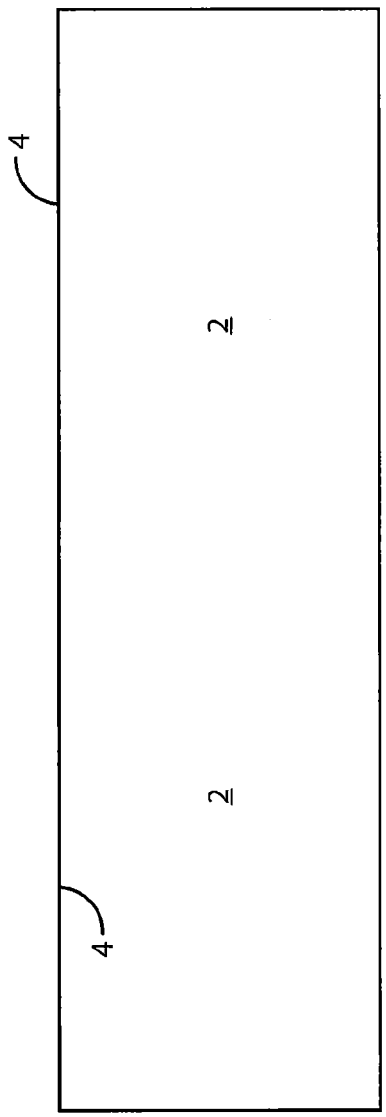
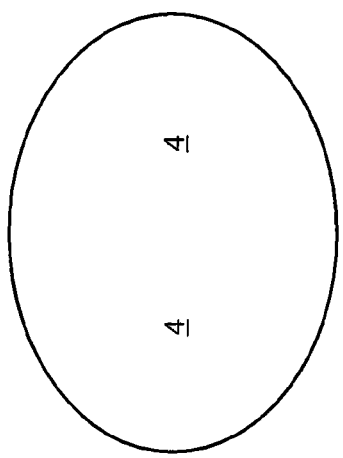
FIG. 1A
FIG. 1B

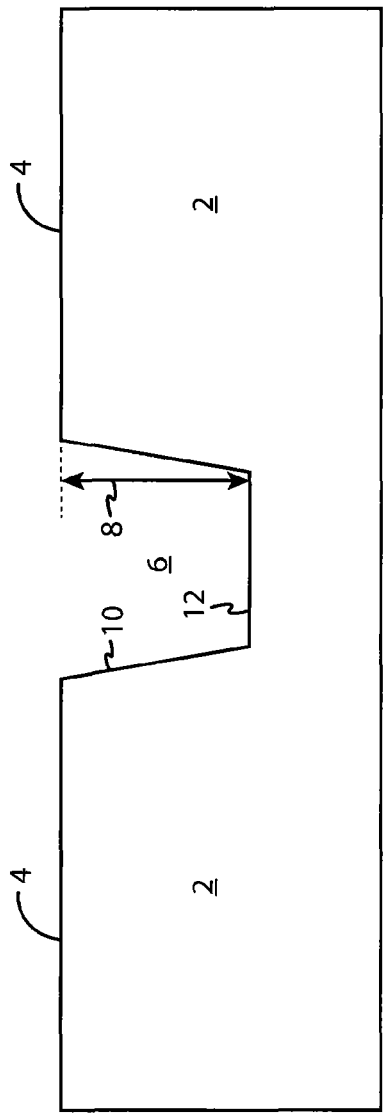
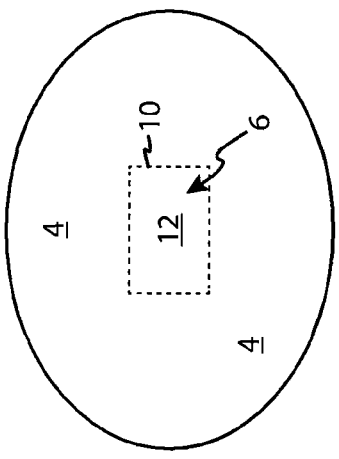
FIG. 2A
FIG. 2B
Cross
Top

Cross

Top

Cross

Top

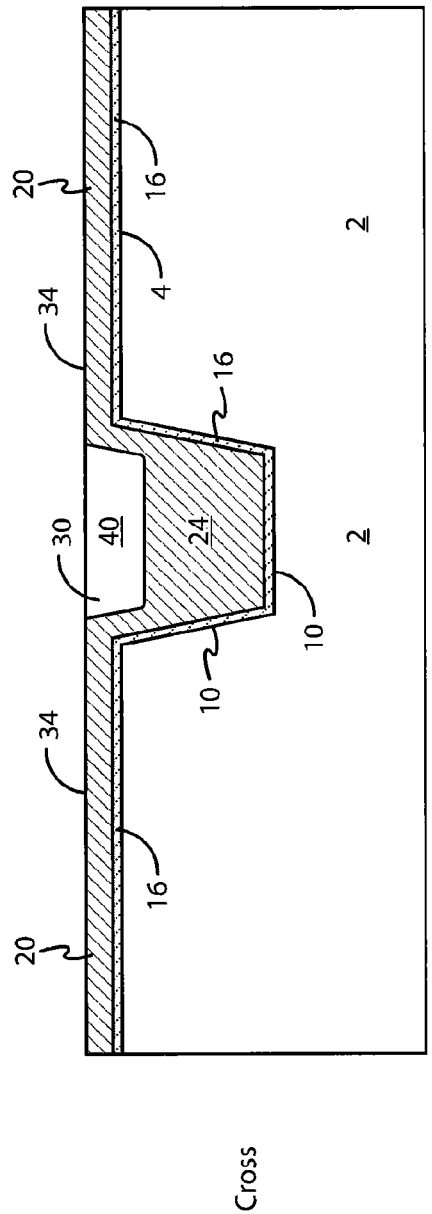
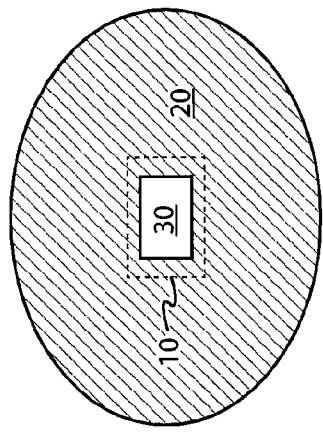
FIG. 6A
FIG. 6B

Cross

Top

Cross

Top

Cross

Top

NITRIDE SHALLOW TRENCH ISOLATION (STI) STRUCTURES

RELATED APPLICATIONS

This application is a divisional application of U.S. patent application Ser. No. 13/222,698, filed on Aug. 31, 2011, the contents of which are incorporated by reference herein in their entireties.

TECHNICAL FIELD

The disclosure relates generally to semiconductor devices and methods for fabricating the same, and more particularly, to a trench isolation structure with a top surface formed of silicon nitride.

BACKGROUND

Integrated circuit and other semiconductor devices are widely used electronic devices that find practically unlimited application in today's world. Designers of these semiconductor devices are continually challenged to increase integration levels by using a multitude of scaled down transistors and other scaled down features to increase device performance and device density. The active devices that are being formed in closer and closer proximity must be electrically isolated from one another.

Shallow trench isolation (STI) is a technique used to reduce isolation width while maintaining the necessary electrical isolation between adjacent active devices. Shallow trench isolation (STI) is being used with integrated circuits in the 0.25 micrometers and below range to achieve necessary performance and design rules. Conventional STI devices employ silicon oxide to fill the shallow trenches and isolate devices.

The oxides for the STI fill are typically deposited using techniques which provide for oxide deposition on the trench bottom, sidewalls, and over the semiconductor substrate in non-trench areas. The nature of the deposition results in a weak seam at the center of the trenches where the oxide from the two sides of the trenches meet. Silicon oxides become attacked in HF (hydrogen fluoride) and other wet chemical solutions which are heavily used in semiconductor processing for operations such as oxide stripping, wet oxide etching, pre-cleans prior to oxide formation processes and pre-cleans prior to other deposition and feature formation processes. Because HF wet processing operations and other wet oxide etching processing operations are so commonly used in semiconductor manufacturing, the oxide STI structures with oxide surfaces are very prone to attack especially when overlying contact layers are not perfectly aligned. The seam at the middle of the STI structure may become attacked, divots may be created at the interface between the STI oxide and the trench sidewall and the entire top surface of the oxide STI structure may become receded progressively with each of the several wet HF processing operations that are subsequently carried out.

It would therefore be advantageous to provide an STI structure that is formed of a durable material that is resistant to attack during subsequent processing operations necessary to manufacture semiconductor devices.

BRIEF DESCRIPTION OF THE DRAWINGS

The present disclosure is best understood from the following detailed description when read in conjunction with the accompanying drawing. It is emphasized that, according to common practice, the various features of the drawing are not necessarily to scale. On the contrary, the dimensions of the various features may be arbitrarily expanded or reduced for clarity. Like numerals denote like features throughout the specification and drawing.

FIGS. 1A and 1B through FIGS. 9A and 9B show a sequence of processing operations according to an exemplary embodiment of the disclosure. In each case, the "A" drawing is a cross-sectional view and the "B" drawing is a corresponding plan view of the central portion of the cross-sectional view.

DETAILED DESCRIPTION

Figure 3A:
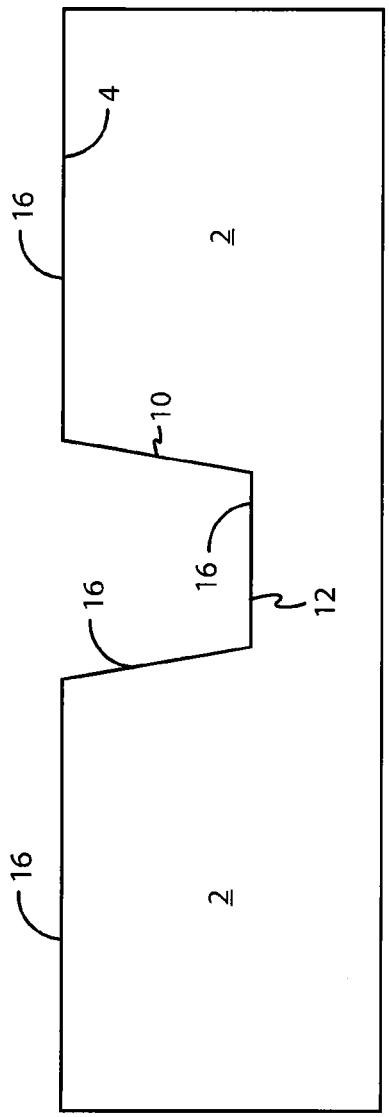

The disclosure provides for forming a silicon nitride STI device having a top surface formed completely of silicon nitride. Because the top surface is completely formed of silicon nitride, the STI structure is not susceptible to attack using HF-based solutions or other solutions used for etching oxides or for cleaning operations commonly used in semiconductor manufacturing.

FIGS. 1A and 1B show an initial step in the sequence of processing operations used to form an exemplary nitride STI structure according to one embodiment of the disclosure. FIG. 1A is a cross-sectional view and FIG. 1B is a corresponding top view of the central portion of FIG. 1A. In each of the following FIGS. 2A and 2B-9A and 9B, the "B" figure shows a corresponding top central portion of the structure shown in cross-section in the "A" figure.

FIGS. 1A and 1B show semiconductor substrate 2 with substrate surface 4. Semiconductor substrate 2 may be formed of silicon but other suitable semiconductor substrate materials may be used in other exemplary embodiments.

FIGS. 2A and 2B show trench 6 extending downwardly by depth 8 from substrate surface 4. Depth 8 may be any of various suitable depths and will vary by application and device type, and trench 6 may be formed to various dimensions. Trench 6 is bounded by sidewalls 10 and bottom 12. Various suitable etching operations are available and may be used in conjunction with conventional patterning operations, to form trench 6. Sidewalls 10 are tapered as seen most clearly in the cross-section of FIG. 2A and various degrees of taper may be achieved.

Figure 3B:
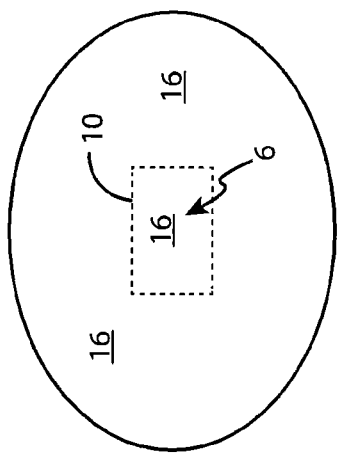

FIGS. 3A and 3B show liner oxide 16 formed over substrate surface 4 and within trench 6 along bottom 12 and sidewalls 10. Liner oxide 16 will be a relatively thin film and may include a thickness ranging from about 50 angstroms to about 300 angstroms depending on the requirements of the technology, in various exemplary embodiments. Conventional thermal oxidation processes may be used to form liner oxide 16, which may be referred to as a pad oxide over substrate surface 4.

Figure 4A:
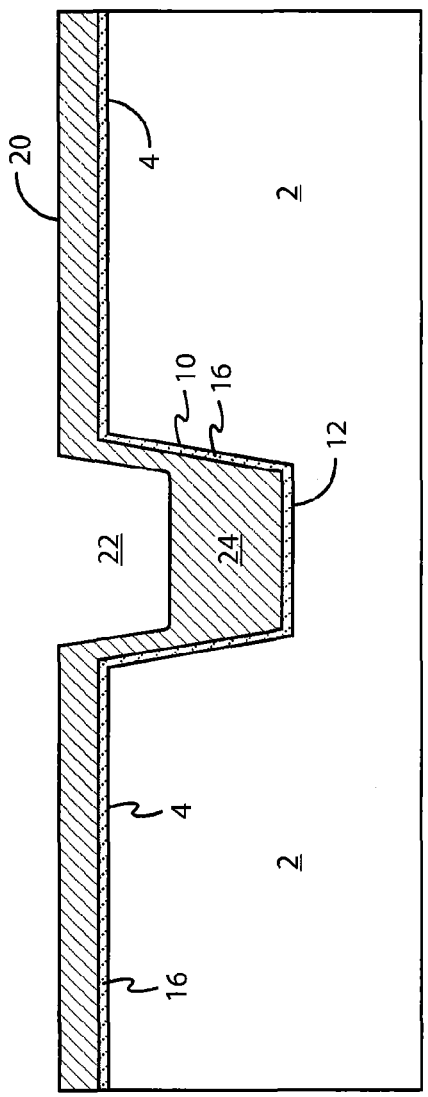
Figure 4B:
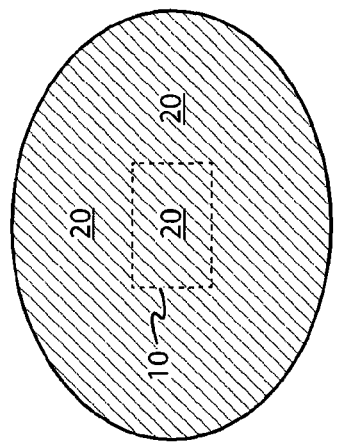

FIGS. 4A and 4B show deposited dielectric 20 formed over the structure previously shown in FIGS. 3A and 3B. Deposited dielectric 20 may preferably be silicon dioxide or another oxide and may be formed using chemical vapor deposition (CVD) or using a sputter deposition operation in which the sputter/etch ratio is optimized to form a conformal deposited dielectric 20 over liner oxide 16. Deposited dielectric 20 covers sidewalls 10, includes a portion 24 in trench 6 and is also disposed over substrate surface 4. Note that portion 24 of deposited dielectric 20 within trench 6 does not fill trench 6, i.e. portion 24 does not extend up to substrate surface 4. In other exemplary embodiments, deposited dielectric 20 may represent various dielectric materials having a dielectric constant, k, of about 3.5-4.5.

Figure 5A:
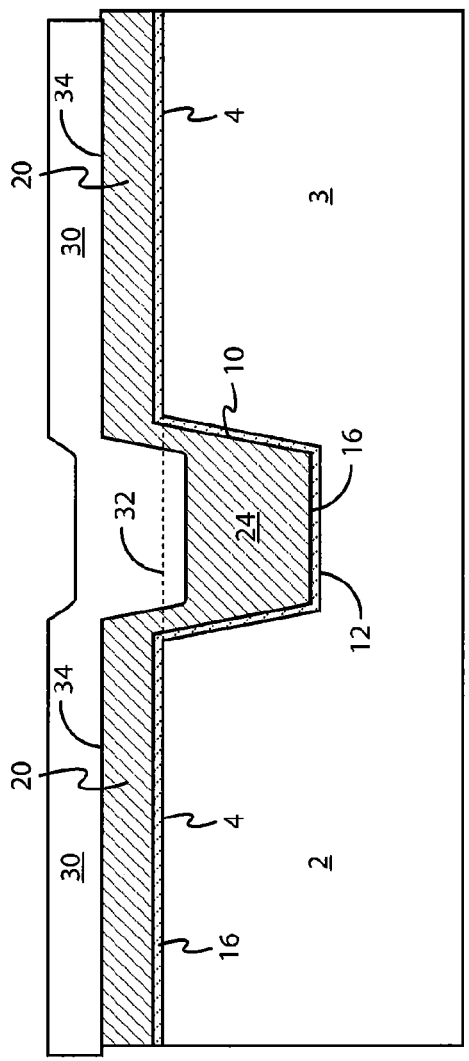
Figure 5B:
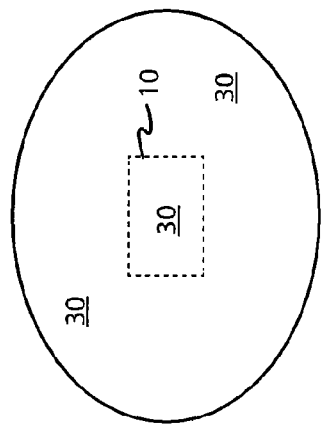

FIGS. 5A and 5B show conformal nitride layer 30 formed over deposited dielectric 20. Various suitable deposition techniques may be used to form conformal nitride 30 such as chemical vapor deposition (CVD), high density plasma (HDP) deposition and plasma enhanced chemical vapor deposition (PECVD). According to other exemplary embodiments, conformal nitride 30 may be formed using a sputter/etch deposition operation with a controlled deposition-to-sputter-etch ratio Conformal nitride 30 fills original trench 6 as conformal nitride layer 30 extends up to and above the level of substrate surface 4, indicated by dashed line 32.

FIGS. 6A and 6B show the structure of FIGS. 5A and 5B after a chemical mechanical polishing (CMP) operation has been used to polish and remove conformal nitride 30 stopping at top surface 34 of deposited dielectric 20, advantageously an oxide in various embodiments. The polishing operation planarizes and exposes deposited dielectric 20 over substrate surface 4 and over peripheral portions of filled trench 6. Nitride portion from conformed nitride 30 remains centrally disposed in filled trench 6. Various suitable CMP operations capable of polishing a nitride material to endpoint on an oxide material or other dielectric, may be used.

Figure 7A:
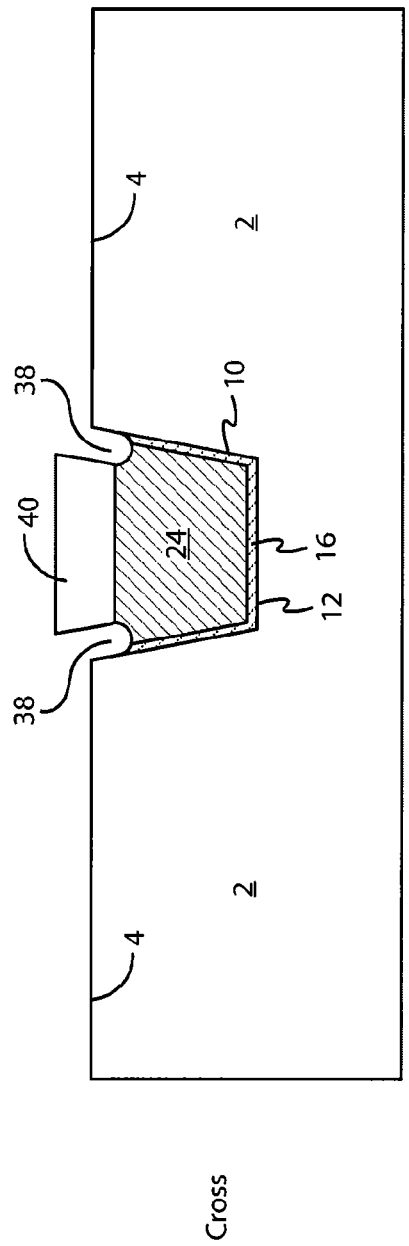
Figure 7B:
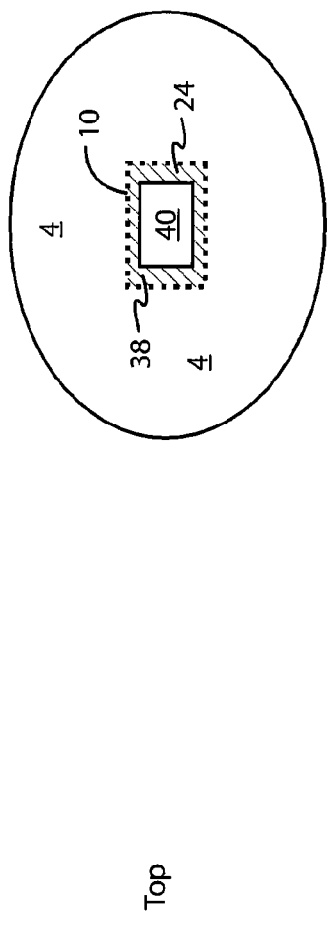

According to the exemplary embodiment in which deposited dielectric 20 is an oxide, a wet, i.e. isotropic oxide etching operation, is carried out and produces the structure shown in FIGS. 7A and 7B. The wet etching operation such as an HF etching solution, removes deposited dielectric 20 and liner oxide 16 from over substrate surface 4 and begins etching portions of deposited dielectric 20 and liner oxide 16 in the trench, producing divots 38, leaving nitride portion 40 and portion 24 in now substantially filled original trench 6.

Figure 8A:
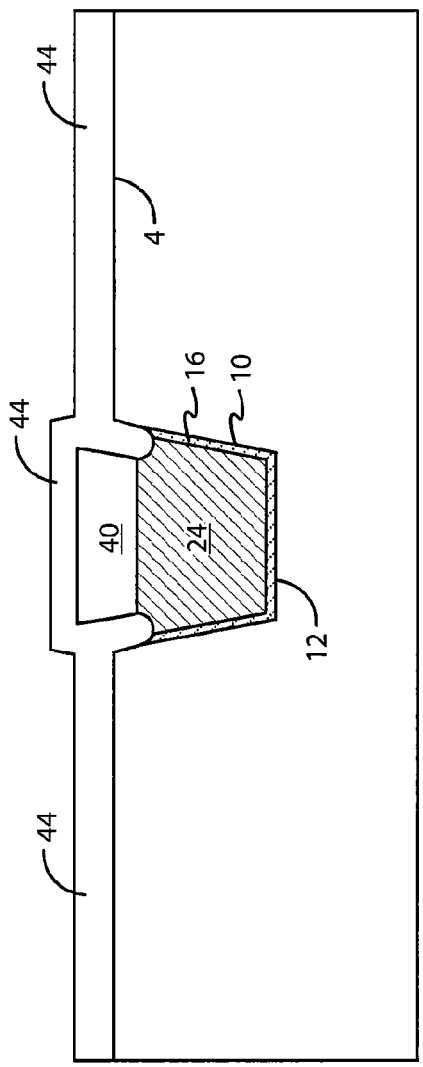
Figure 8B:
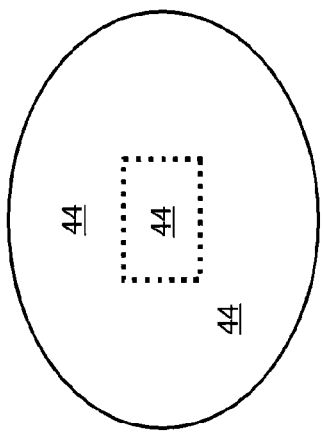

FIGS. 8A and 8B show nitride layer 44 conformally formed over substrate surface 4 and over the materials in original trench 6 and filling divots 38 previously shown in FIGS. 7A, 7B. Various suitable nitride deposition methods may be used such as but not limited to CVD, chemical vapor deposition, HDP, high density plasma and PECVD, plasma enhanced chemical vapor deposition.

Figure 9A:
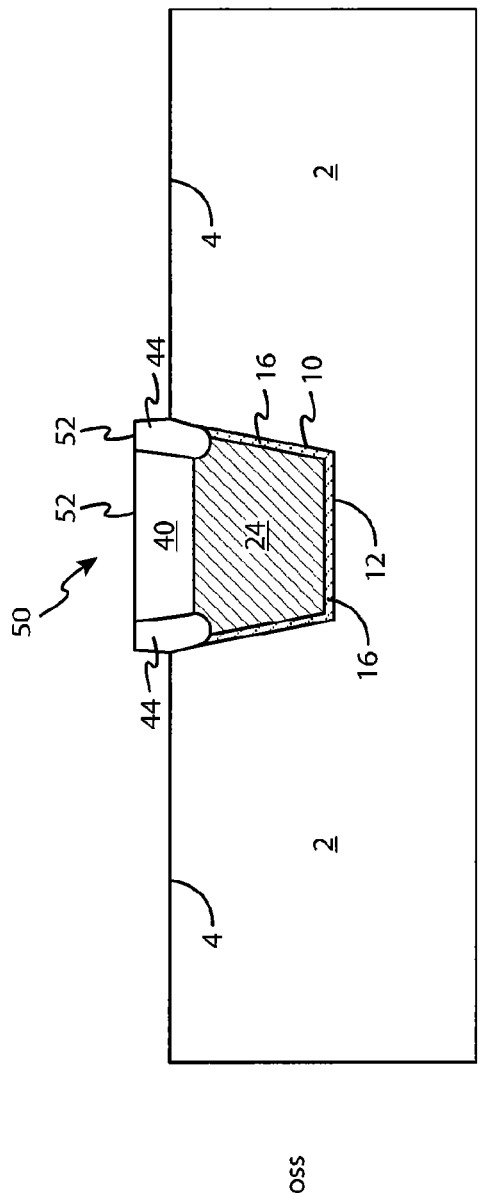
Figure 9B:
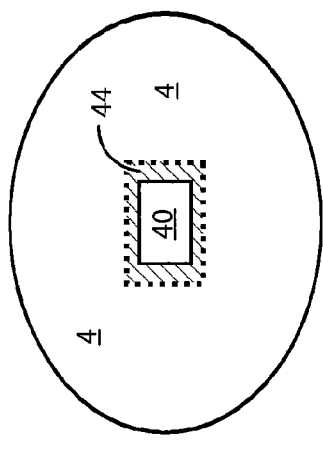

FIGS. 9A and 9B show the structure of FIGS. 8A and 8B after a patterning operation has been used in conjunction with an anisotropic etching operation to mask the region of filled trench 6 and remove materials from over substrate surface 4 and produce STI structure 50. STI structure 50 includes liner oxide 16, portion 24 of deposited dielectric and an upper nitride portion consisting of nitride portion 40 of conformal nitride 30 (see FIGS. 6A and 6B) and sections of nitride layer 44. Portion 24 and deposited dielectric 20 of FIGS. 4A and 4B may advantageously be an oxide. STI structure 50 includes top surface 52 raised above substrate 4 and consisting completely of silicon nitride, in particular portions of conformal nitride 30 and of nitride layer 44. FIG. 9A clearly illustrates that the portions of STI structure 50 above substrate surface 4 are all nitride materials. In some exemplary embodiments, STI structure 50 shown in FIG. 9A may be further planarized to recede top surface 52 to a height where it is coplanar with substrate surface 4. CMP may be used. It can be seen that the bulk of STI structure 50 consists of portion 24 of deposited dielectric 20. The portion of STI structure 50 that may be formed of portion 24 of deposited dielectric 20 may range from about 40% to about 90% in various exemplary embodiments.

FIGS. 10-16 illustrate another exemplary method for forming an STI structure having an upper surface consisting completely of silicon nitride.

Figure 10:
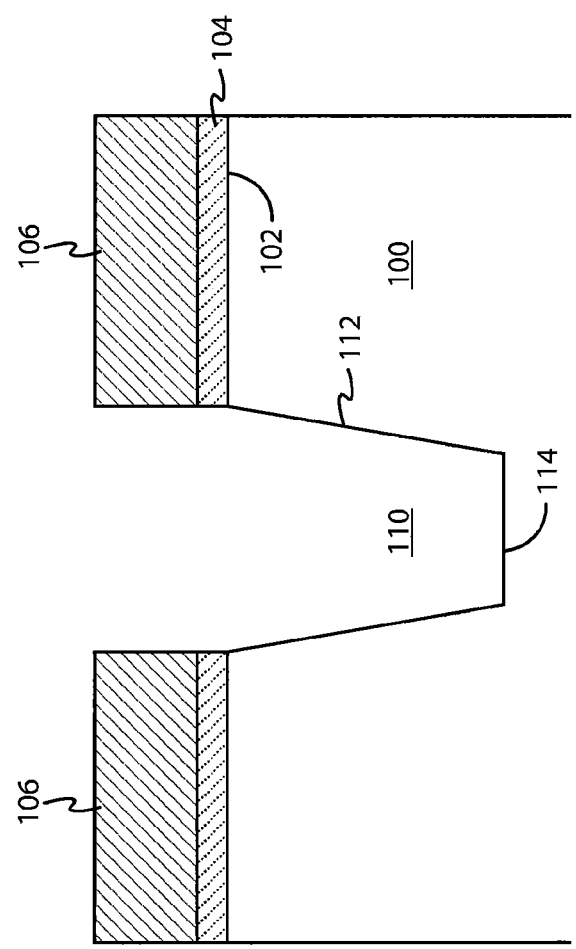
FIGS. 10-16 are cross-sectional views illustrating another exemplary sequence of processing operations according to the disclosure.

FIG. 10 shows substrate 100 which may be silicon or other suitable substrate materials and patterned photoresist 106 formed over substrate surface 102. In particular, patterned photoresist 106 is formed over optional anti-reflective coating, ARC layer 104. FIG. 10 shows the structure after a substantially anisotropic etch has been used to form trench 110 extending downwardly from substrate surface 102 of substrate 100. Various suitable etch operations may be used. Trench 110 is defined by bottom 114 and sidewalls 112, which are advantageously tapered. Trench 110 may be formed to various suitable dimensions. Subsequently, patterned photoresist 106 and optional ARC layer 104 are stripped using conventional or other methods.

Figure 11:
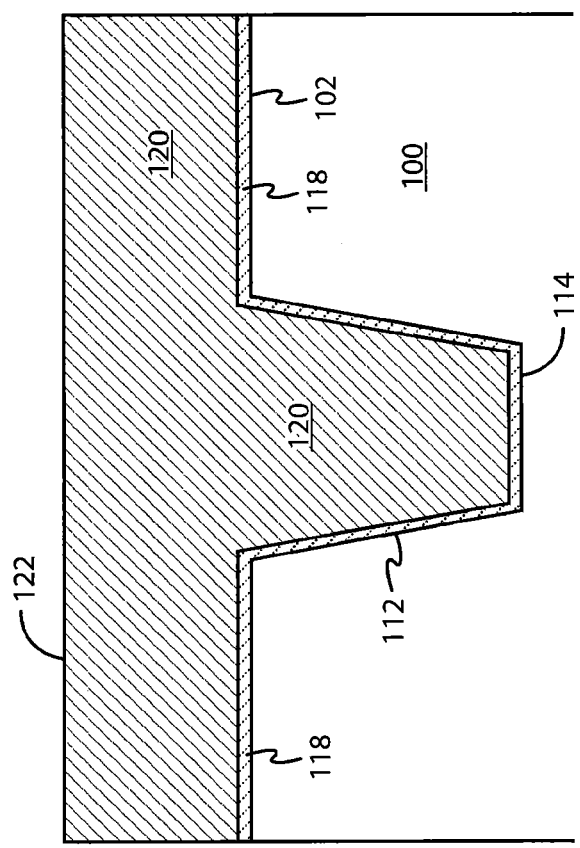

FIG. 11 shows the structure of FIG. 10 after ARC 104 and patterned photoresist 106 have been removed and after liner oxide 118 has been formed on substrate surface 102 and along bottom 114 and sidewalls 112 of former trench 110. Various suitable thermal oxide deposition techniques may be used and liner oxide 118 is often referred to as a pad oxide when disposed over substrate surface 102. Nitride layer 120 is formed over liner oxide 118 and fills previous trench 110. Nitride layer 120 is formed over substrate surface 102, in particular on liner oxide 118 formed over substrate surface 102. Various suitable deposition techniques may be used to form nitride layer 120 including but not limited to CVD, PECVD, HDP, or various other suitable nitride deposition techniques. In other exemplary embodiments, nitride layer 120 may be formed by sputter deposition. The conformality and contour of nitride layer 120 may be determined by the D/S ratio, i.e. the deposition-to-sputter etch ratio of the deposition process used to form nitride layer 120. It should be further noted that, while upper surface 122 of nitride layer 120 appears as substantially planar in the illustrated embodiment, in some embodiments, upper surface 122 may actually include a crevice centrally disposed over filled trench 110 at locations where the nitride layers formed on the respective sidewalls 112, meet, essentially forming a centrally disposed seam in nitride layer 120. Nitride layer 120 may include a bulk thickness over substrate surface 102 depending on the depth of the trench, of about 3000 angstroms to about 6000 angstroms as required for filling the trench and for the subsequent planarization processes.

Figure 12:
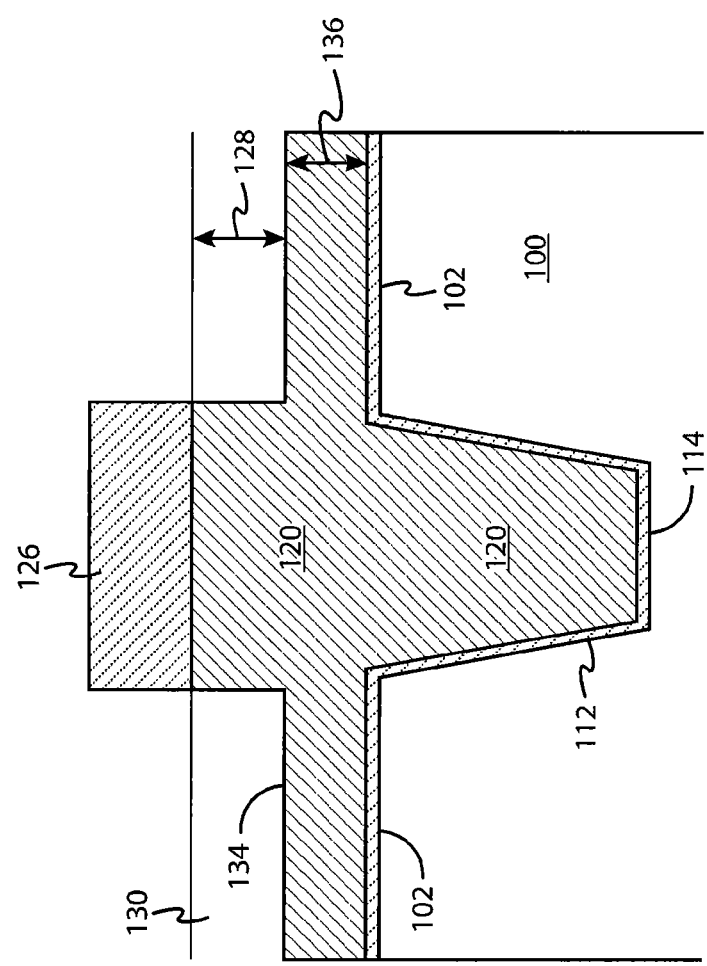

FIG. 12 illustrates an optional step in the processing sequence and shows patterned photoresist 126 formed over filled trench 110. Various known photoresist patterning means may be used to form patterned photoresist 126. An etching operation is used to recede the original upper surface 122 by depth 128 to remove portion 130 of nitride layer 122 to produce the structure shown in FIG. 12 that includes receded nitride surface 134. In one exemplary embodiment, depth 128 may range from about 1000-3000 angstroms to produce remaining thickness 136 of about 1500-2500 angstroms but other depths 128 and other remaining thicknesses 136 may be used in other exemplary embodiments. In one exemplary embodiment, remaining thickness 136 may be about 2000 angstroms. Again, it is pointed out that the operation shown in FIG. 112 is optional and in other exemplary embodiments, may not be used.

Figure 13:
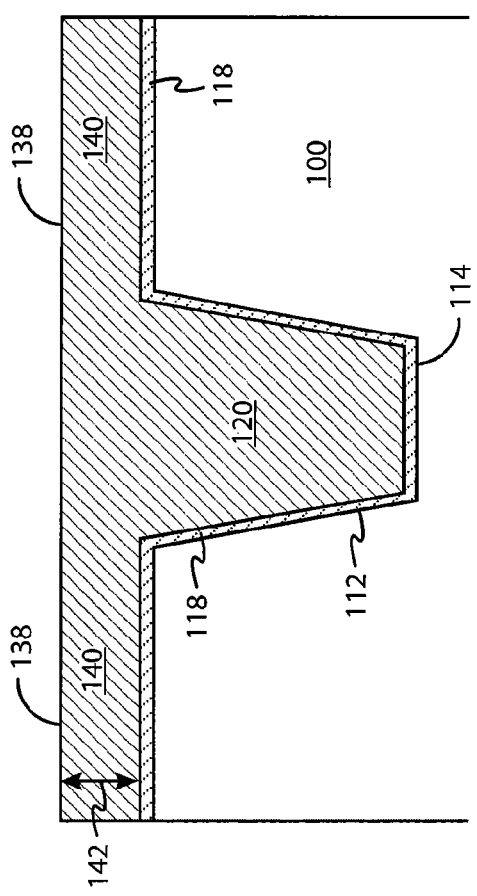

A chemical mechanical polishing, CMP, operation may be used to form the structure shown in FIG. 13. The CMP operation may polish the structure shown in FIG. 11 or the structure shown in FIG. 12 and will be advantageously be a timed polishing operation. According to the exemplary embodiment in which the structure in FIG. 11 is being polished to produce the structure shown in FIG. 13, a timed dry etching operation may alternatively be used. FIG. 13 shows receded nitride layer 140 with upper surface 138 and thickness 142 which may range from about 500-2000 angstroms in one exemplary embodiment and most preferably may be about 1000 angstroms. Upper surface 138 is a planar surface.

Nitride is removed from the structure shown in FIG. 13 using a nitride removal operation which may be a dry etching operation or a wet etching operation such as using $H_3PO_4$ to strip down to liner oxide 118 which may be used as an endpoint film. A subsequent isotropic oxide removal operation such as an HF dip may then be used to remove liner oxide 118 from over substrate surface 102, to produce the structure shown in FIG. 14.

Figure 14:
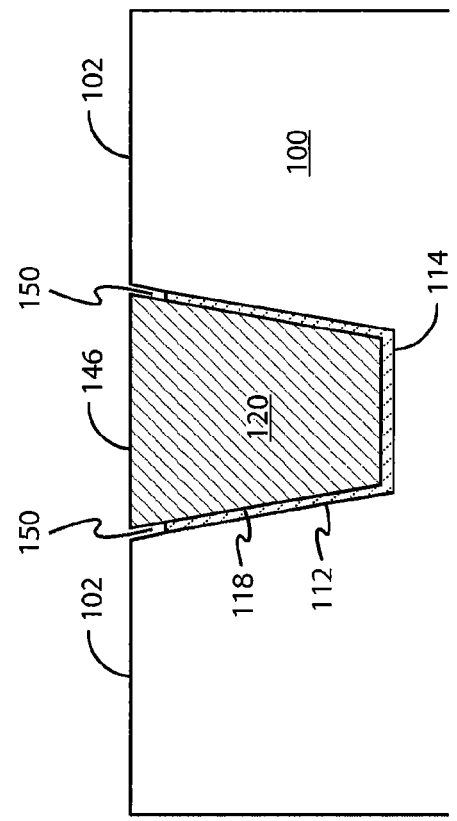

FIG. 14 shows substrate surface 102 exposed after previous nitride layer 120 and liner oxide 118 have been removed from over substrate surface 102. Within original trench 110 remains nitride layer 120 with a substantially planar top surface 146. Divots 150 represent the vertical portions of liner oxide 118 that have been removed from alongside sidewalls 112 during the isotropic oxide removal operation. Divots 150 may extend to various depths.

Figure 15:
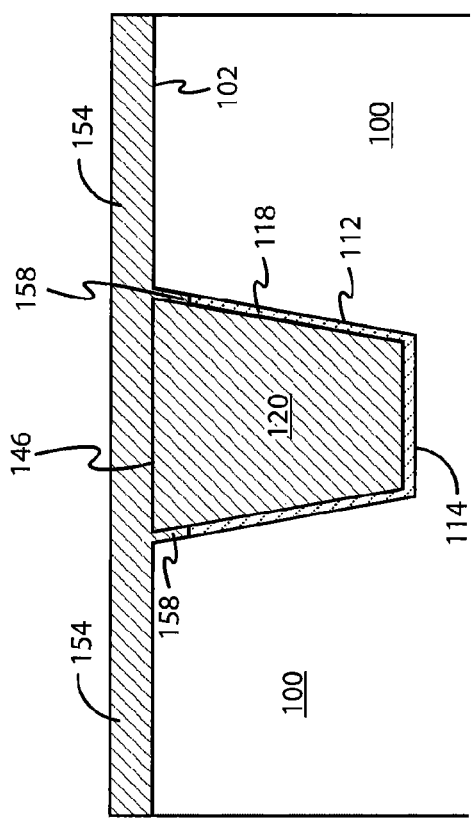

FIG. 15 shows the structure of FIG. 14 after a capping nitride deposition operation is used to form cap nitride 154 over substrate surface 102 and top surface 146 and filling previous divots 150. A plasma enhanced nitride deposition method may be used in one exemplary embodiment and CVD or PECVD may be used in other exemplary embodiments. Nitride plugs 158 plug the previous divots 150.

Figure 16:
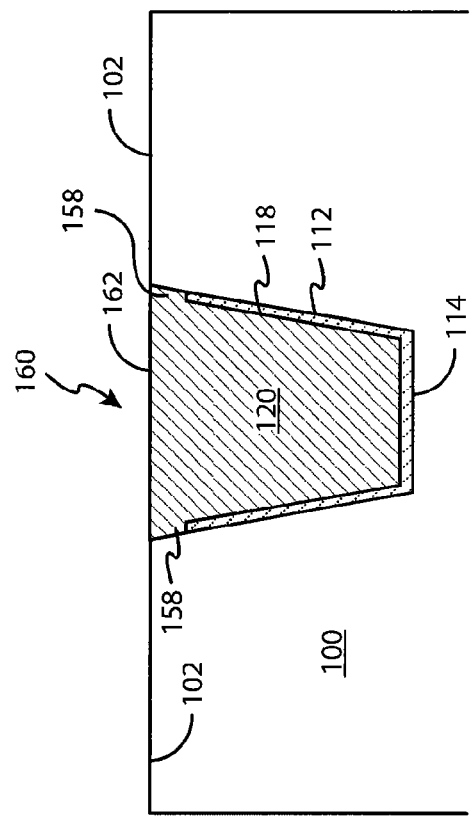

A dry etching or polishing operation is performed on the structure shown in FIG. 15 to produce the structure shown in FIG. 16. If a dry etching operation is used, the process may be terminated by end point when cap nitride 154 is removed from over substrate surface 102 or it may be a timed dry etching operation. The structure in FIG. 16 shows STI structure 160, including planar top surface 162 which is formed completely of silicon nitride, including encapsulating nitride plugs 158 at the lateral edges of the STI structure 160. The structure in FIG. 16 provides the advantages of an upper surface formed completely of silicon nitride and also the advantage of an upper surface that is completely planar with respect to substrate surface 102.

According to one aspect, provided is a shallow trench isolation (STI) structure comprising a dielectric isolation structure filling a trench extending downwardly from a top substrate surface of a semiconductor substrate, the dielectric isolation structure including an upper surface consisting entirely of silicon nitride.

According to another aspect, a method for forming a silicon nitride STI structure is provided. The method comprises: providing a semiconductor substrate with an upper silicon surface with pad oxide thereon and a trench extending downwardly from said upper silicon surface and including a liner oxide lining said trench; depositing silicon nitride filling the trench opening and over the pad oxide, the silicon nitride having a nitride thickness over said upper silicon surface. The method further comprises: planarizing the silicon nitride; performing at least one of a wet nitride etch and a dry nitride etch to substantially uniformly recede the silicon nitride and remove the silicon nitride from over the pad oxide to expose the pad oxide; performing a wet oxide etch to remove the pad oxide, the wet oxide etch dip creating divots along sidewalls of the trench by etching upper parts of the liner oxide; redepositing silicon nitride, the redepositing including filling said divots; and dry etching the silicon nitride in a blanket etching operation to expose the upper silicon surface.

According to yet another aspect, a method for forming a shallow trench isolation structure where the silicon nitride top surface is provided. The method comprises: providing a semiconductor substrate with a substrate surface with a trench extending downwardly from the substrate surface, and a liner oxide lining said trench; depositing a deposited oxide in the trench and over the substrate surface, the deposited oxide having a top surface recessed below the substrate surface in the trench; and, depositing a conformal silicon nitride film that fills the trench and extends over the deposited oxide. The method further comprises: polishing to planarize by removing the silicon nitride from over the deposited oxide over the substrate surface thereby forming a nitride upper portion over the deposited oxide in the trench and exposing the deposited oxide over the surface oxide; performing a wet oxide etch that removes the deposited oxide and the surface oxide from over the substrate surface and forms a divot along sidewalls of the trench; depositing silicon nitride to fill the divots and over the substrate surface; and anisotropically etching to remove the silicon nitride from over the upper surface substrate thereby producing the STI structure having an upper surface formed completely of the silicon nitride.

The preceding merely illustrates the principles of the disclosure. It will thus be appreciated that those skilled in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those skilled in the art without departing from the scope and range of equivalents of the disclosure.

What is claimed is:
1. A shallow trench isolation (STI) structure comprising a dielectric isolation structure filling a trench extending downwardly from a top semiconductor surface of a semiconductor substrate, said dielectric isolation structure including an upper surface comprised entirely of silicon nitride, wherein said upper surface is co-planar with and extends to said top semiconductor surface.

2. The STI structure as in claim 1, further comprising an oxide liner on inner surfaces of said trench and disposed between said inner surfaces and said dielectric isolation structure.

3. The STI structure as in claim 1, wherein said upper surface terminates laterally at sidewalls of said trench.

4. The STI structure as in claim 1, wherein a majority of said dielectric isolation structure comprises an oxide material.

5. The STI structure as in claim 1, wherein a lower portion of said dielectric isolation structure comprises an oxide material.

6. The STI structure as in claim 1, wherein a majority of said dielectric isolation structure comprises a dielectric having a dielectric constant of about 3.5 to 4.5.

7. The STI structure as in claim 1, further comprising an oxide liner on a bottom surface of said trench and extending upwardly along sidewalls of said trench but terminating prior to said top substrate surface.

8. A shallow trench isolation (STI) structure comprising a dielectric isolation structure filling a trench extending downwardly from a top semiconductor surface of a semiconductor substrate, said dielectric isolation structure including an oxide material and a nitride material and an upper surface comprised entirely of said nitride material, wherein said upper surface is co-planar with and extends to said top semiconductor surface.

9. The STI structure as in claim 8, wherein said nitride material comprises silicon nitride.

10. The STI structure as in claim 8, wherein said nitride material consists entirely of silicon nitride and said upper surface consists entirely of said nitride material.

11. The STI structure as in claim 10, wherein said oxide material comprises an oxide liner on inner surfaces of said trench.

12. A shallow trench isolation (STI) structure comprising a dielectric isolation structure filling a trench extending downwardly from a top semiconductor surface of a semiconductor substrate, said dielectric isolation structure including a nitride material, a further dielectric material having a dielectric constant of about 3.5 to 4.5 and an upper surface entirely comprised of said nitride material, wherein said further dielectric material comprises a majority of said dielectric isolation structure, wherein said upper surface is co-planar with and extends to said top semiconductor surface.

13. The STI structure as in claim 12, wherein said nitride material comprises silicon nitride and said further dielectric material comprises a silicon oxide.

14. The STI structure as in claim 12, further comprising an oxide liner on inner surfaces of said trench and disposed between said inner surfaces and said dielectric isolation structure.

15. A shallow trench isolation (STI) structure comprising a dielectric isolation structure filling a trench, said trench defined by an oxide liner formed on sidewalls and a bottom of an opening extending downwardly from a top semiconductor surface of a semiconductor substrate, said oxide liner not extending to said top semiconductor surface and said trench filled with silicon nitride, wherein said dielectric isolation structure comprises entirely silicon nitride.

16. The STI structure as in claim 15, wherein an upper surface of said dielectric isolation structure is coplanar with said top semiconductor surface.

* * * * *